(12) United States Patent
Cho et al.

(10) Patent No.: US 10,915,386 B2
(45) Date of Patent: Feb. 9, 2021

(54) INTEGRATED CIRCUIT AND BATTERY MANAGEMENT SYSTEM INCLUDING THE SAME

(71) Applicant: Samsung SDI Co., Ltd., Yongin-si (KR)

(72) Inventors: Wonkyoung Cho, Yongin-si (KR); Yongchun Kim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 274 days.

(21) Appl. No.: 16/024,471

(22) Filed: Jun. 29, 2018

(65) Prior Publication Data

US 2019/0227863 A1    Jul. 25, 2019

(30) Foreign Application Priority Data

Jan. 22, 2018  (KR) .......................... 10-2018-0007970

(51) Int. Cl.
*G06F 11/00* (2006.01)
*G06F 11/07* (2006.01)
(Continued)

(52) U.S. Cl.
CPC ........ *G06F 11/0736* (2013.01); *G01R 31/371* (2019.01); *G01R 31/396* (2019.01);
(Continued)

(58) Field of Classification Search
CPC ............. G06F 11/0736; G06F 11/0751; G06F 11/079; H02J 7/00036; H02J 3/32;
(Continued)

(56) References Cited

U.S. PATENT DOCUMENTS 8,089,248 B2    1/2012  Tabatowski-Bush
2007/0086475 A1*  4/2007  Clemens ............. H04L 65/1043
                                            370/458
(Continued)

FOREIGN PATENT DOCUMENTS

CN    101442211 A    5/2009
CN    101692502 A    4/2010
(Continued)

OTHER PUBLICATIONS

EPO Extended Search Report dated May 6, 2019, for corresponding European Patent Application No. 18195803.4 (9 pages).
(Continued)

*Primary Examiner* — Jason B Bryan
(74) *Attorney, Agent, or Firm* — Lewis Roca Rothgerber Christie LLP (57) ABSTRACT

A battery management system includes: a plurality of slave controllers configured to be respectively connected with a plurality of battery modules to generate battery sensing information related to the respective battery modules; and a master controller connected with an uppermost slave controller from among the slave controllers, wherein each of the slave controllers includes a first receiver and a first transmitter configured to communicate with a preceding slave controller or the master controller and a second receiver and a second transmitter configured to communicate with a following slave controller, and each of the slave controllers is configured to connect the first receiver with the first transmitter or the second receiver with the second transmitter depending on types of diagnosis packets inputted through the first receiver.

12 Claims, 6 Drawing Sheets

(51) Int. Cl.
  *H02J 3/32* (2006.01)
  *H02J 13/00* (2006.01)
  *H02J 7/00* (2006.01)
  *G01R 31/396* (2019.01)
  *G01R 31/371* (2019.01)

(52) U.S. Cl.
  CPC ........ *G06F 11/079* (2013.01); *G06F 11/0751* (2013.01); *H02J 3/32* (2013.01); *H02J 7/00036* (2020.01); *H02J 13/0013* (2013.01)

(58) Field of Classification Search
  CPC ............... H02J 13/0013; H02J 7/00047; H02J 13/00006; G01R 31/396; G01R 31/371; G01R 31/3606
  See application file for complete search history.

(56) References Cited

U.S. PATENT DOCUMENTS

2014/0029172 A1* 1/2014 Yoo ........................... H02J 1/10
  361/679.01
2014/0322573 A1 10/2014 Nishiwaki et al.
2015/0270727 A1* 9/2015 Fukute ............... H01M 10/482
  320/107

FOREIGN PATENT DOCUMENTS

| | | |
|---|---|---|
| CN | 102064356 A | 5/2011 |
| CN | 203218952 U | 9/2013 |
| CN | 103580089 A | 2/2014 |
| CN | 106532163 A | 3/2017 |
| EP | 2725686 A1 | 4/2014 |
| EP | 2840643 A1 | 2/2015 |
| JP | 2012-130249 A | 7/2012 |
| JP | 2014-217146 A | 11/2014 |
| KR | 10-1540086 B1 | 7/2015 |
| KR | 10-1695641 B1 | 1/2017 |
| KR | 10-2017-0056061 A | 5/2017 |

OTHER PUBLICATIONS

Chinese Office Action dated Dec. 1, 2020, issued in corresponding Chinese Patent Application No. 201811072961.8 (8 pages).

* cited by examiner

INTEGRATED CIRCUIT AND BATTERY MANAGEMENT SYSTEM INCLUDING THE SAME

CROSS-REFERENCE TO RELATED APPLICATION

The present application claims priority to and the benefit of Korean Patent Application No. 10-2018-0007970 filed in the Korean Intellectual Property Office on Jan. 22, 2018, the entire content of which is incorporated herein by reference.

BACKGROUND

1. Field

Aspects of some example embodiments of the present invention relate to an integrated circuit and a battery management system including the same.

2. Description of the Related Art

Generally, a battery management system (BMS) may be utilized for managing a high voltage battery used for an environmentally-friendly vehicle, an energy storage device, and/or the like. The BMS may serve, for example, to determine whether or not a battery or a battery module is operating abnormally, and to control the output of a main power source. For example, the BMS may facilitate and control electrical connections between a plurality of battery modules, in which several tens to several hundreds of batteries are modularized in groups, that are connected in series and operate as a main power source. Additionally, the BMS may monitor the performance and condition of each battery or battery module.

The BMS may include a master controller and a plurality of slave controllers for battery management. Each of the slave controllers may include an integrated circuit including a voltage-detecting circuit mounted therein, for example, an analog front end (AFE) IC.

The AFE ICs may communicate with each other by being connected in series by a daisy chain method. Because the AFE ICs are connected in series, when a specific AFE IC or a specific communication route is damaged by external noise or physical pressure, the master controller may not receive data from the AFE IC.

In addition, when a failure occurs in a specific AFE IC or a specific communication route, it may be difficult to detect which part or component in the overall system has failed.

The above information disclosed in this Background section is only for enhancement of understanding of the background of the invention and therefore it may contain information that does not constitute prior art.

SUMMARY

Some example embodiments of the present invention may solve or reduce the aforementioned problems and other problems. Some example embodiments may include an integrated circuit capable of detecting a failed voltage-detecting IC or communication route, and a battery management system including the same.

According to some example embodiments of the present invention, a battery management system includes: a plurality of slave controllers configured to be respectively connected with a plurality of battery modules to generate battery sensing information related to the respective battery modules; and a master controller connected with an uppermost slave controller from among the slave controllers, wherein each of the slave controllers includes a first receiver and a first transmitter configured to communicate with a preceding slave controller or the master controller and a second receiver and a second transmitter configured to communicate with a following slave controller, and each of the slave controllers is configured to connect the first receiver with the first transmitter or the second receiver with the second transmitter depending on types of diagnosis packets inputted through the first receiver.

According to some example embodiments, the diagnosis packets include at least one of a first diagnosis packet that indicates one of the slave controllers or a second diagnosis packet that indicates a communication route between two slave controllers.

According to some example embodiments, each of the slave controllers includes: a voltage detector configured to generate the battery sensing information related to the connected battery modules; an interface section configured to perform communications through the first receiver, the first transmitter, the second receiver, and the second transmitter; and a controller configured to add test data into the first diagnosis packet received through the first receiver, to form a first loopback route by connecting the second receiver and the second transmitter, to transmit the first diagnosis packet added with the test data to the first loopback route, and to transmit a first error checking packet to the first transmitter when the first diagnosis packet added with the test data is not received, or when the test data added into the first diagnosis packet received through the first receiver is different from the test data included in the first diagnosis packet received through the first loopback route.

According to some example embodiments, the controller is configured to form a second loopback route by connecting the first receiver and the first transmitter and to transmit the second diagnosis packet to the second loopback route in response to receiving the second diagnosis packet through the first receiver.

According to some example embodiments, the controller is configured to transmit a second error checking packet to the first transmitter in response to the second diagnosis packet not being received through the second receiver within a predetermined period of time.

According to some example embodiments, the master controller is configured to determine, in response to receiving the first error checking packet, that a defect has occurred in a slave controller that has transmitted the first error checking packet.

According to some example embodiments, the master controller is configured to determine, in response to receiving a second error checking packet, that a defect has occurred in a communication route between the slave controller that has transmitted a second error checking packet and a subsequent slave controller of the slave controller.

According to some example embodiments of the present invention, an integrated circuit includes: a voltage detector configured to be connected with at least one battery cell to detect a cell voltage of the at least one battery cell; an interface section including: a first receiver and a first transmitter configured to communicate with a preceding integrated circuit; and a second receiver and a second transmitter configured to communicate with a subsequent integrated circuit; and a controller configured to connect the first receiver with the first transmitter or the second receiver with the second transmitter depending on types of diagnosis packets inputted through the first receiver.

According to some example embodiments, the diagnosis packets include at least one of a first diagnosis packet that indicates one of a plurality of integrated circuits or a second diagnosis packet that indicates a communication route between two integrated circuits.

According to some example embodiments, the controller is configured to: add test data into the first diagnosis packet received through the first receiver; form a first loopback route by connecting the second receiver and the second transmitter; transmit the first diagnosis packet added with the test data to the first loopback route; and transmit a first error checking packet to the first transmitter when the first diagnosis packet added with the test data is not received, or when the test data added into the first diagnosis packet received through the first receiver is different from the test data included in the first diagnosis packet received through the first loopback route.

According to some example embodiments, the controller is configured to: form a second loopback route by connecting the first receiver and the first transmitter; and transmit the second diagnosis packet to the second loopback route in response to receiving the second diagnosis packet through the first receiver.

According to some example embodiments, the controller is configured to transmit a second error checking packet to the first transmitter in response to not receiving the second diagnosis packet through the second receiver within a predetermined period of time.

According to some example embodiments of the present invention, it may be possible to detect whether or not a failure has occurred in the voltage-detecting IC or the communication route when communications are not performed between the master controller and the slave controllers.

According to some example embodiments of the present invention, after a failure is detected, the communication may be re-performed using an alternative communication route, and/or a portion of the circuit where the failure has occurred may be quickly repaired.

DETAILED DESCRIPTION

Hereinafter, aspects of some example embodiments of the present invention will be described in more detail with reference to the accompanying drawings.

In the present specification, the same or similar components will be denoted by the same or similar reference numerals, and some repeated description thereof may be omitted.

The terms "module" and "unit" for components used in the following description are used only in order to easily make a specification. Therefore, these terms do not have meanings or roles that distinguish them from each other in themselves.

Further, in describing aspects of example embodiments of the present specification, when it is determined that a detailed description of the well-known art associated with the present invention may obscure or distract from the description of example embodiments of the present invention, such description may be omitted for brevity.

In addition, the accompanying drawings are provided to facilitate a more thorough description and understanding of certain aspects of example embodiments disclosed in the present specification, and the drawing should not to be interpreted as limiting the spirit of the disclosed embodiments in the present specification. Rather, it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to the other component or may be connected or coupled to the other component with another component intervening therebetween. On the other hand, it is to be understood that when one component is referred to as being "directly connected" or "coupled directly" to another component, it is connected or coupled to the other component without another component intervening therebetween.

Singular forms are to include plural forms unless the context clearly indicates otherwise.

It will be further understood that terms "comprise" or "have" used in the present specification specify the presence of stated features, numerals, steps, operations, components, parts, or a combination thereof, but do not preclude the presence or addition of one or more other features, numerals, steps, operations, components, parts, or a combination thereof.

Hereinafter, an integrated circuit and a battery management system according to some example embodiments of the present invention will be described in more detail with reference to the accompanying drawings.

Figure 1:
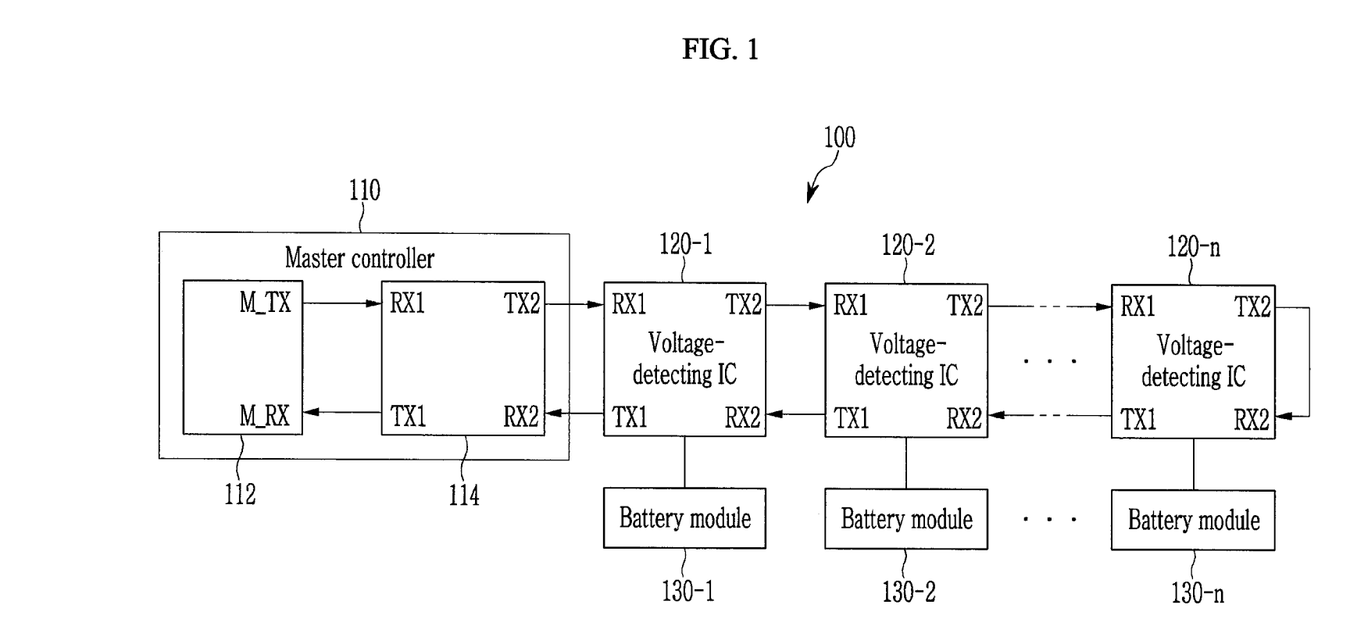
FIG. 1 is a block diagram illustrating a battery management system according to some example embodiments of the present invention.

FIG. 1 is a block diagram illustrating a battery management system according to some example embodiments of the present invention. As illustrated in FIG. 1, the battery management system 100 includes a master controller 110 and a plurality of slave controllers (voltage-detecting ICs) 120-1, 120-2, . . . , and 120-n.

The master controller 110 generally controls the system 100 by using state information of battery modules 130-1, 130-2, . . . , and 130-n monitored by the voltage-detecting ICs 120-1, 120-2, . . . , and 120-n. The number of slave controllers 120-1 through 120-n and the number of battery modules 130-1 through 130-n may vary according to the design of the battery management system 100 and the corresponding electrical device being powered by the battery management system 100, and embodiments of the present invention are not limited to the number illustrated in FIG. 1.

To control the battery management system 100, the master controller 110 includes a communication module 114 serving to communicate with a control module 112 and the voltage-detecting ICs 120-1, 120-2, . . . , and 120-n.

The control module 112 may generally control the master controller 110 in order to control the system 100. For example, the control module 112 transmits control information including address information and command information of the voltage-detecting ICs 120-1, 120-2, . . . , and 120-n to the voltage-detecting ICs 120-1, 120-2, . . . , and 120-n, receives sensing information (e.g., battery-sensing information) related to the battery modules 130-1, 130-2, . . . , and 130-n transmitted from the voltage-detecting ICs 120-1, 120-2, . . . , and 120-n in response to the control information, and controls the system 100 by using the sensing information.

The control module 112 uses the communication module 114 to communicate with the voltage-detecting ICs 120-1, 120-2, . . . , and 120-n. The control module 112 may include terminals M_TX and M_RX for communicating with the communication module 114.

The communication module 114, which serves to facilitate communication between the control module 112 and the voltage-detecting ICs 120-1, 120-2, . . . , and 120-n, transfers the control information transmitted from the control module 112, to the voltage-detecting ICs 120-1, 120-2, . . . , and 120-n, and transfers the battery sensing information transmitted from the voltage-detecting ICs 120-1, 120-2, . . . , and 120-n, to the control module 112.

According to some embodiments, the communication module 114 may be implemented to encode the control information transmitted from the control module 112 by using an asynchronous differential signal and to decode the battery sensing information transmitted from the voltage-detecting ICs 120-1, 120-2, . . . , and 120-n.

The communication module 114 may be directly connected with a voltage-detecting IC (uppermost slave controller) 120-1 closest to the master controller 110. The communication module 114 may include first terminals RX1 and TX1 for communication with the control module 112 and second terminals TX2 and RX2 for communication with the voltage-detecting ICs 120-1, 120-2, . . . , and 120-n.

The voltage-detecting ICs 120-1, 120-2, . . . , and 120-n communicate with the master controller 110 in a state of being connected in a daisy chain structure. The voltage-detecting ICs 120-1, 120-2, . . . , and 120-n are respectively connected with the battery modules 130-1, 130-2, . . . , and 130-n.

The voltage-detecting ICs 120-1, 120-2, . . . , and 120-n sense the battery modules 130-1, 130-2, . . . , and 130-n in response to a request of the master controller 110 to generate battery sensing information, and transfer the generated battery sensing information to the master controller 110.

The voltage-detecting ICs 120-1, 120-2, . . . , and 120-n may sense battery cell states of the battery modules 130-1, 130-2, . . . , and 130-n to sense cell voltages, cell balancing, cell temperatures, and cooling states of the cell batteries.

Each of the voltage-detecting ICs 120-1, 120-2, . . . , and 120-n include a terminal for communication with a preceding part (or previous voltage-detecting IC) and a terminal for communication with a following part (or subsequent voltage-detecting IC).

For example, the voltage-detecting IC 120-1 may include first terminals RX1 and TX1 for communication with the master controller 110 positioned in a preceding stage and second terminals TX2 and RX2 for communication with the voltage-detecting IC 120-2 positioned in a following (or subsequent) stage.

As another example, the voltage-detecting IC 120-n may include first terminals RX1 and TX1 for communication with a voltage-detecting IC positioned in a preceding stage and second terminals TX2 and RX2 connected thereto to form a route to the master controller 110.

Herein, 'TX' indicates an output terminal, 'RX' indicates an input terminal, '1' indicates a terminal for communication with a part positioned in a preceding stage (preceding part), and '2' indicates a terminal for communication with a part positioned in a following stage (following part or subsequent part).

An output terminal and an input terminal may be individually configured for communication with a preceding part, and may be configured as one input and output terminal. Similarly, an output terminal and an input terminal may be individually configured for communication with a following part (or subsequent part), and may be configured as one input and output terminal When the output terminal and the input terminal for communication with the preceding part is configured as one input and output terminal, each of the voltage-detecting ICs 120-1, 120-2, . . . , and 120-n may communicate with the preceding part bidirectionally through one input and output terminal. When the output terminal and the input terminal for communication with the following part is configured as one input and output terminal, each of the voltage-detecting ICs 120-1, 120-2, . . . , and 120-n may communicate with the following part bidirectionally through one input and output terminal.

In addition, the preceding stage and the following (or subsequent) stage may be differently analyzed according to a communication direction. However, in the present example embodiment, based on the communication module 114 of the master controller 110, a part positioned closer to the communication module 114 is referred to as a preceding part, and a part positioned further away from the communication module 114 is referred to as a following part.

Data transmitted from the master controller 110 to the voltage-detecting ICs 120-1, 120-2, . . . , and 120-n and transmitted from the voltage-detecting ICs 120-1, 120-2, . . . , and 120-n to the master controller 110 is sequentially transmitted from the master controller 110 to the voltage-detecting IC 120-1 to the voltage-detecting IC 120-n through a first one of two routes (connecting TX2 and RX1). In addition, data transmitted from the master controller 110 to the voltage-detecting ICs 120-1, 120-2, . . . , and 120-n is sequentially transmitted from the voltage-detecting IC 120-n to the master controller 110 via the voltage-detecting IC 120-1 through a second one of two routes (connecting TX2 and RX1). These routes connect the master controller 110 with each of the voltage-detecting ICs 120-1, 120-2, . . . , and 120-n, to form a daisy chain.

Each of the battery modules 130-1, 130-2, . . . , and 130-n may be configured to include a plurality of modularized cells, and may be provided as an aggregate in which a plurality of cells are connected in series or in parallel. Because the battery modules 130-1, 130-2, . . . , and 130-n belong to a technology that is common in the battery management field, a detailed description related to the battery modules 130-1, 130-2, . . . , and 130-n will be omitted.

Hereinafter, a battery-managing method of the battery management system described above will be described in more detail.

Figure 2:
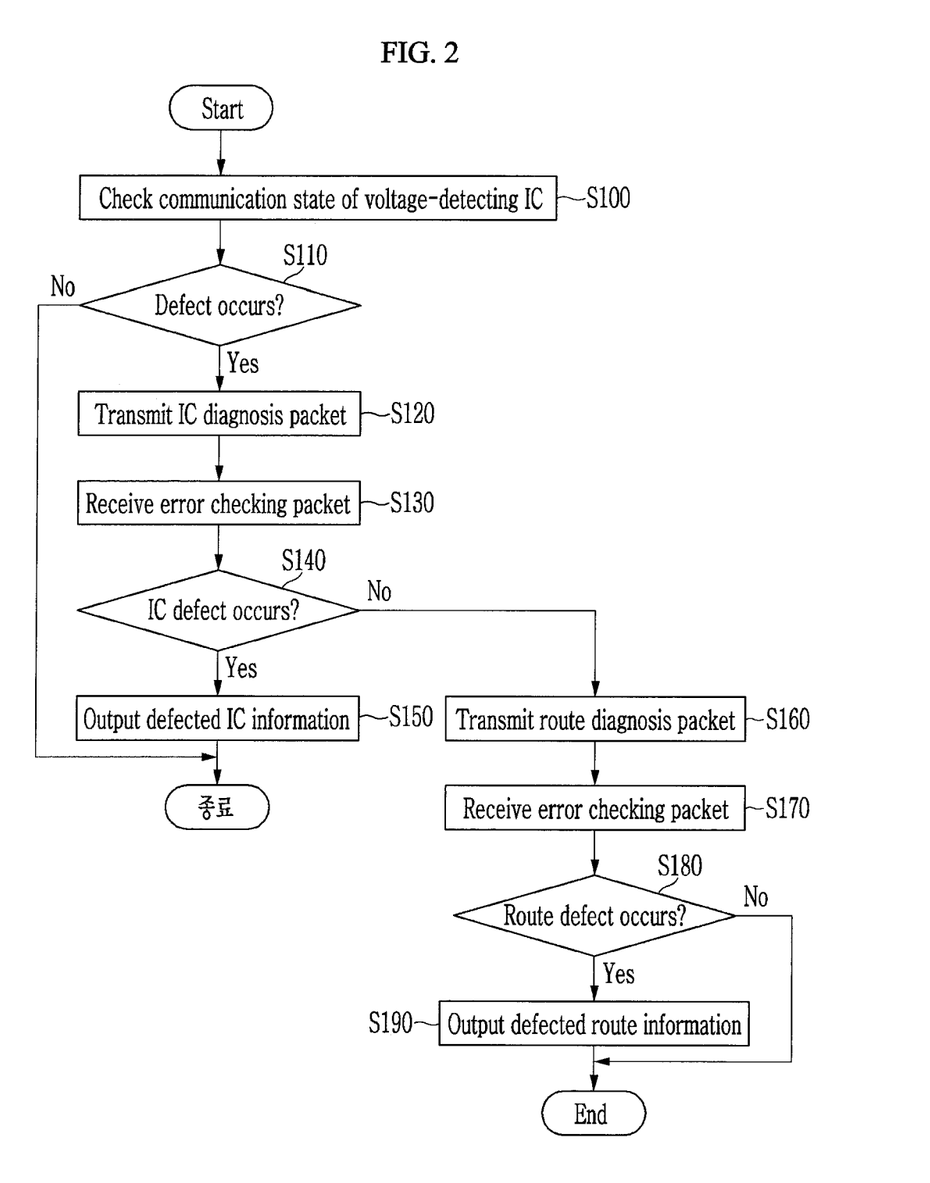
FIG. 2 is a flowchart illustrating a battery-managing method according to some example embodiments of the present invention.

FIG. 2 is a flowchart illustrating a battery-managing method according to some example embodiments of the present invention. As illustrated in FIG. 2, the master controller 110 checks communication states of the voltage-detecting ICs 120-1, 120-2, . . . , and 120-n (S100). For example, the master controller 110 may transmit control information to each of the voltage-detecting ICs 120-1, 120-2, . . . , and 120-n, and then may check the communication states of the voltage-detecting ICs 120-1, 120-2, . . . , and 120-n based on whether or not battery sensing information corresponding to the control information is received.

Next, the master controller 110 determines whether or not a defect has occurred in the communication states of the voltage-detecting ICs 120-1, 120-2, . . . , and 120-n (S110). In this case, the master controller 110 may determine whether or not a defect has occurred in the communication states of the voltage-detecting ICs 120-1, 120-2, . . . , and 120-n based on whether or not battery sensing information related to all the battery modules 130-1, 130-2, . . . , and 130-n in the system 100 is received by the master controller 110 (e.g., within a predetermined period of time). For example, if battery sensing information related to all of the battery modules 130-1, 130-2, . . . , and 130-n in the system 100 is received by the master controller 110 within a period of time (e.g., a predetermined period of time), the master controller 110 may determine that a defect has not occurred, and the process may end. If, however, battery sensing information related to all of the battery modules 130-1, 130-2, . . . , and 130-n in the system 100 is not received by the master controller 110 within the period of time (e.g., the predetermined period of time), the master controller 100 may determine that a defect has occurred.

In response to determining that a defect has occurred in the communication states, the master controller 110 transmits IC diagnosis packets to the voltage-detecting ICs 120-1, 120-2, . . . , and 120-n (S120). An operation of the voltage-detecting ICs receiving the IC diagnosis packets will be described in more detail with reference to FIGS. 2 and 3.

Figure 3:
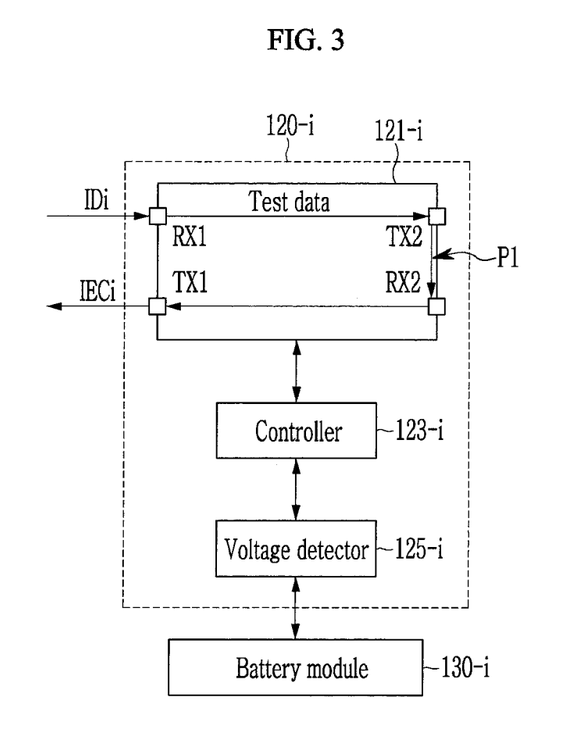
FIG. 3 illustrates an example of detecting a failure of a voltage-detecting IC according to some example embodiments of the present invention.

FIG. 3 illustrates an example of detecting a failure of a voltage-detecting IC as part of the battery-managing method according to some example embodiments of the present invention.

As shown in FIG. 3, a voltage-detecting IC 120-i includes an interface section 121-i, a controller 123-i, and a voltage detector 125-i.

The interface section 121-i may serve as a daisy chain interface which communicates with a communication circuit of another voltage-detecting IC in a daisy chain manner.

The voltage detector 125-i may be electrically connected with at least one cell constituting the battery module 130-i, to measure a cell voltage of each cell. The voltage detector 125-i may include an analog digital converter (ADC) for converting a cell voltage of each detected cell as an analog value into a digital value.

The controller 123-i serves as a controller in the voltage-detecting IC 120-i, and may control the interface section 121-i and the voltage detector 125-i. For example, the controller 123-i may control the voltage detector 125-i to select a cell to be a voltage-detecting target among a plurality of cells constituting the battery module 130-i.

In addition, for example, the controller 123-i may transfer a cell voltage detected by the voltage detector 125-i to the master controller 110 by using the interface section 121-i.

When an IC diagnosis packet Idi is transferred to a receiver RX1 of the voltage-detecting IC 120-i, the controller 123-i adds a test data packet into the IC diagnosis packet Id. In addition, the controller 123-i forms a loopback route by connecting terminals TX2 and RX2 for communication with a following part.

Then, the IC diagnosis packet IDi into which the test data packet is added returns to the master controller 110 instead of being transferred to a voltage-detecting IC positioned in a following stage.

When a transmitter TX2 and a receiver RX2 are configured as one input and output terminal to facilitate bidirectional communications, the IC diagnosis packet IDi into which the test data packet is added returns to the master controller 110 without forming an additional loopback route by the controller 123-i.

The controller 123-i compares test data added to the IC diagnosis packet IDi transferred from the receiver RX1 with test data added to a packet transferred through the terminal RX2.

When the two test data are different from each other, or when no data is received through the terminal RX2 within a period of time (e.g., a predetermined period of time), the controller 123-i transmits an error checking packet IEC1 including identification information of the corresponding voltage-detecting IC 120-i and error occurrence information to the master controller 110.

In this manner, the master controller 110 receives error checking packets from the voltage-detecting ICs 120-1, 120-2, . . . , and 120-n in response to the IC diagnosis packets (S130).

The master controller 110 determines whether or not a defect has occurred in each IC from the error checking packets (S140).

The master controller 110 may repeat steps S120, S130, and S140 until it detects the voltage-detecting IC (from among the voltage-detecting ICs 120-1 through 120-n) at which the defect has occurred. Further details of steps S120, S130, and S140 will be described below with reference to FIGS. 2 and 4.

Figure 4:
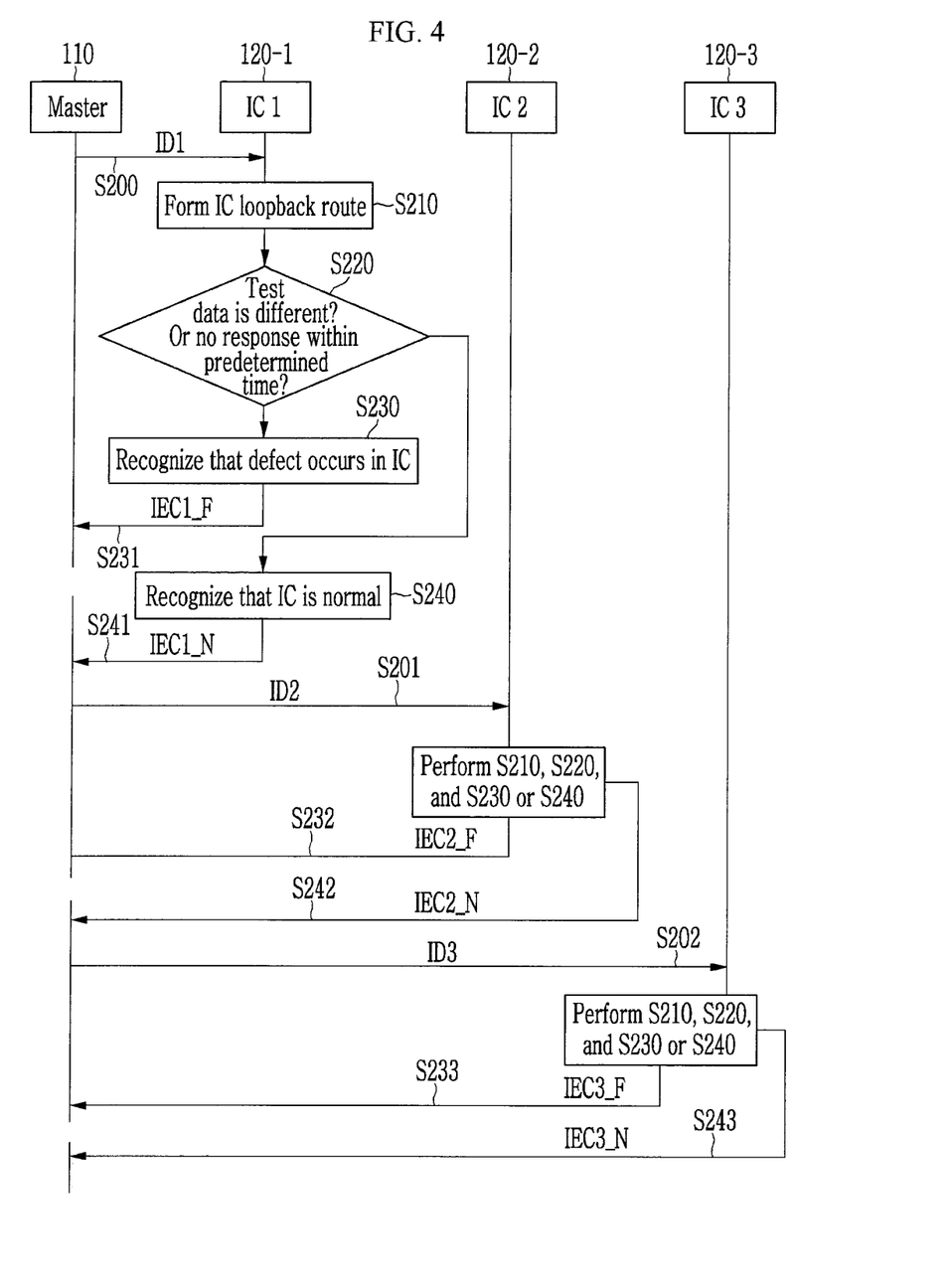
FIG. 4 is a flowchart schematically illustrating steps of detecting a failure of a voltage-detecting IC as part of a battery-managing method according to some example embodiments of the present invention.

FIG. 4 is a flowchart schematically illustrating steps of detecting a failure of a voltage-detecting IC as part of the battery-managing method according to some example embodiments of the present invention.

As shown in FIG. 4, the master controller 110 transmits the IC diagnosis packet ID1 corresponding to the voltage-detecting IC 120-1 to the voltage-detecting IC 120-1 (S200).

Then, the voltage-detecting IC 120-1 forms a loopback route (S210), and adds test data to the IC diagnosis packet ID1 to transmit it through the loopback route.

The voltage-detecting IC 120-1 determines whether or not test data added into the IC diagnosis packet ID1 is different from test data added into the packet transferred through the loopback route, or whether or not data is transferred through the loopback route within a period of time (e.g., a predetermined period of time) (S220).

In step S220, in response to the test data added into the IC diagnosis packet ID1 being different from the test data added into the packet transferred through the loopback route, or in response to the data not being transferred through the loopback route within the period of time (e.g., the predetermined period of time), the voltage-detecting IC 120-1 recognizes that a defect has occurred at the voltage detecting IC (S230), and transfers an error checking packet IEC1_F indicating that the voltage-detecting IC 120-1 is defective to the master controller 110 (S321).

In step S220, in response to the test data added into the IC diagnosis packet ID1 being identified as identical to the test data added into the packet transferred through the loopback route, and the data being transferred within the period of time (e.g., the predetermined period of time), the voltage-detecting IC 120-1 recognizes that the IC is normal (S240), and transmits an error checking packet IEC1_N indicating that the voltage-detecting IC 120-1 is normal to the master controller 110 (S241).

Next, when receiving the error checking packet IEC1_N indicating that the voltage-detecting IC 120-1 is normal, the master controller 110 transmits an IC diagnosis packet ID2 corresponding to the voltage-detecting IC 120-2 to the voltage-detecting IC 120-2 (S201).

Then, the voltage-detecting IC 120-2 performs steps S210 and S220, performs step S230 according to the result of step S220, transfers an error checking packet IEC2_F indicating that the voltage-detecting IC 120-2 is defective to the master controller 110 (S232) or performs step S240, and transfers an error checking packet IEC2_N indicating that the voltage-detecting IC 120-2 is normal to the master controller 110 (S242).

Similarly, when receiving the error checking packet IEC2_N indicating that the voltage-detecting IC 120-2 is normal, the master controller 110 may check whether or not a defect has occurred in the voltage-detecting IC 120-3 by transmitting an IC diagnosis packet ID3 corresponding to the voltage-detecting IC 120-3 to the voltage-detecting IC 120-3 (S202).

Then, the voltage-detecting IC 120-3 performs steps S210 and S220, performs step S230 according to the result of step S220, transfers an error checking packet IEC3_F indicating that the voltage-detecting IC 120-3 is defective to the master controller 110 (S233) or performs step S240, and transfers an error checking packet IEC2_N indicating that the voltage-detecting IC 120-3 is normal to the master controller 110 (S243).

The battery management system 100 may continue with the same or similar operations illustrated in FIG. 4 for each of the voltage-detecting ICs 120-4 through 120-n, until the system determines whether or not any defects have occurred at any of the voltage-detecting ICs operating as part of the battery management system 100.

When recognizing that a voltage-detecting IC is defective, the master controller 110 may output information of the defective voltage-detecting IC (S150 in FIG. 2).

When no defect occurs in the IC, the master controller 110 transmits a route diagnosis packet to the voltage-detecting ICs 120-1, 120-2, . . . , and 120-n.

An operation of the voltage-detecting IC receiving the route diagnosis packet will be described in more detail with reference to FIG. 5.

Figure 5:
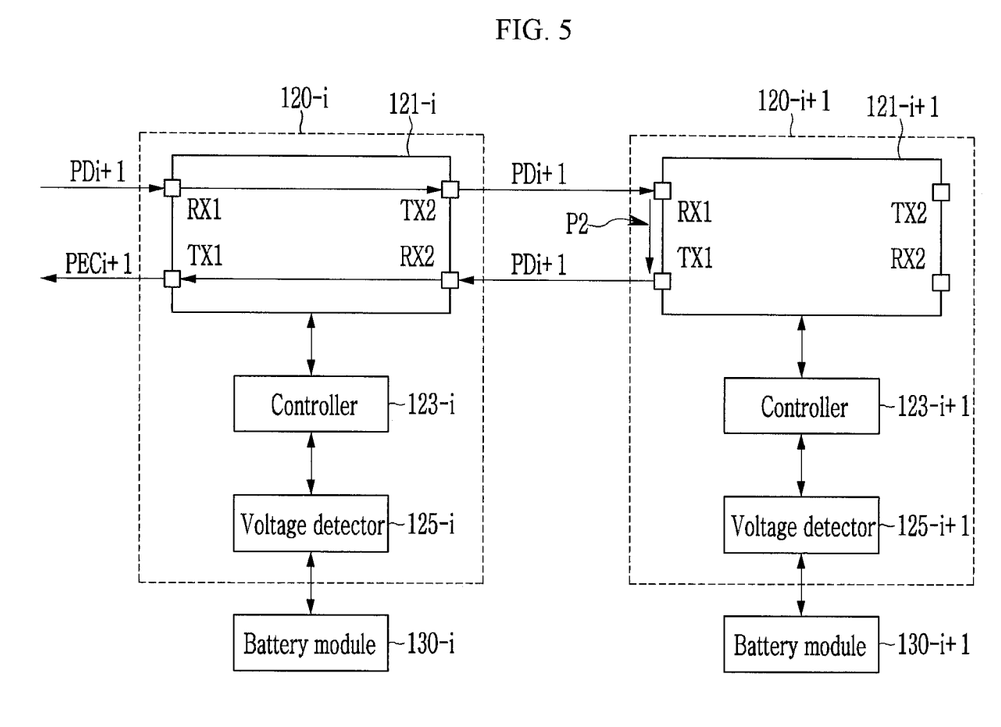
FIG. 5 illustrates an example of detecting a failure of a communication route according to the battery-managing method of FIG. 2.

FIG. 5 illustrates an example of detecting a failure of a communication route as part of the battery-managing method illustrated in FIG. 2, according to some example embodiments of the present invention.

As shown in FIGS. 2 and 5, when a route diagnosis packet PD2 is transferred to the receiver RX1 of the voltage-detecting IC 120-i, the controller 123-i transfers a route diagnosis packet PD(i+1) to a following stage voltage-detecting IC 120-(i+1) through the transmitter TX2. The route diagnosis packet PD(i+1) may include information indicating a route between two voltage-detecting ICs 120-i and 120-(i+1).

The following stage voltage-detecting IC 120-(i+1) forms a loopback route by connecting the receiver RX1 and the transmitter TX1 to each other in order to diagnose whether or not the route indicated by the route diagnosis packet PD(i+1), that is, the route between the two voltage-detecting ICs 120-i and 120-(i+1), is defective.

Then, the route diagnosis packet PD(i+1) returns to the receiver RX2 of the voltage-detecting IC 120-1 through the loopback route.

When the transmitter TX1 and the receiver RX1 are configured as one input and output terminal to facilitate bidirectional communications, the IC diagnosis packet PD(i+1) into which the test data packet is added returns to the voltage-detecting IC 120-i (e.g., a transceiver of the voltage-detecting IC 120-i) without forming an additional loopback route by the controller 123-(i+1).

When the packet is not received through the terminal RX2 within a period of time (e.g., a predetermined period of time), the controller 123-i transmits an error checking packet PEC including identification information of the corresponding route and error occurrence information to the master controller 110.

The master controller 110 receives error checking packets from the voltage-detecting ICs 120-1, 120-2, . . . , and 120-n in response to the route diagnosis packet (S170).

The master controller 110 determines whether or not a defect has occurred in each route from the error checking packets (S180).

The master controller 110 may repeatedly perform steps S160, S170, and S180 until detecting a communication route in which a defect occurs. A process for detecting a communication route in which a defect occurs will be described in more detail below with reference to FIG. 6.

Figure 6:
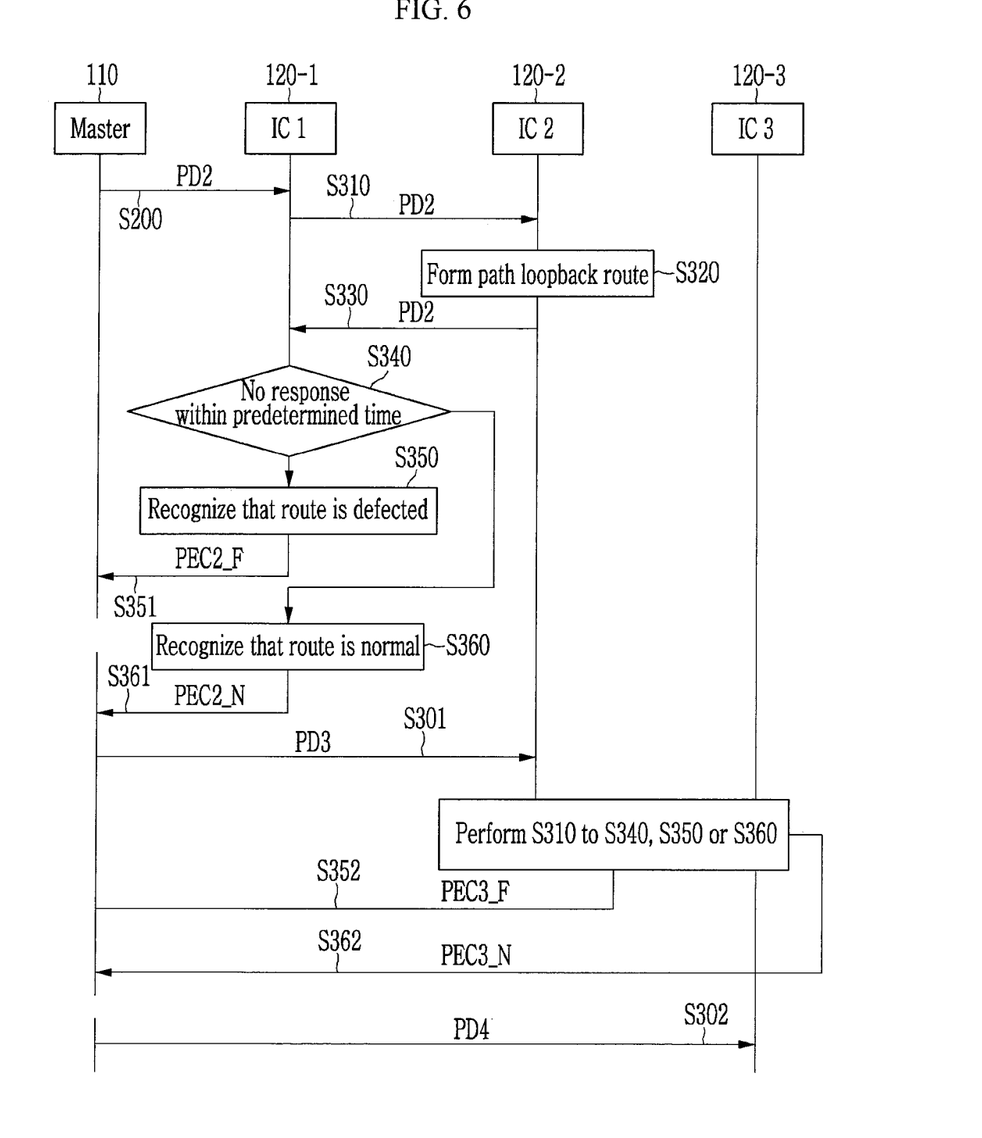
FIG. 6 is a flowchart schematically illustrating steps of detecting a failure of a communication route according to the battery-managing method of FIG. 2.

FIG. 6 is a flowchart schematically illustrating steps of detecting a failure of a communication route as part of the battery-managing method of FIG. 2, according to some example embodiments of the present invention.

As shown in FIG. 6, the master controller 110 transmits a route diagnosis packet PD2 corresponding to a route between the voltage-detecting IC 120-1 and the voltage-detecting IC 120-2 to the voltage-detecting IC 120-1 (S300). Then, the voltage-detecting IC 120-1 transfers the route diagnosis packet PD2 to the following stage voltage-detecting IC 120-2 (S310). Then the following stage voltage-detecting IC 120-2 forms a loopback route (S320), and transmits the route diagnosis packet PD2 through the loopback route (S330).

The voltage-detecting IC 120-1 determines whether or not the route diagnosis packet PD2 is transferred through the loopback route within a period of time (e.g., a predetermined period of time) (S340).

In step S340, in response to the route diagnosis packet PD2 not being transferred through the loopback route within the period of time (e.g., the predetermined period of time), the voltage-detecting IC 120-1 recognizes that there is a defect outside of the voltage-detecting IC, that is, there is a defect within the communication route (S350), and the voltage-detecting IC 120-1 transfers an error checking packet PEC2_F indicating that a defect occurs in the route between the voltage-detecting IC 120-1 and the voltage-detecting IC 120-2 to the master controller 110 (S351).

In step S340, in response to the route diagnosis packet PD2 being transferred through the loopback route within the period of time (e.g., the predetermined period of time), the voltage-detecting IC 120-1 recognizes that the communication route is normal (S360), and the voltage-detecting IC 120-1 transfers an error checking packet PEC2_N indicating that the communication route is normal to the master controller 110 (S361).

Next, when receiving the error checking packet IEC1_N indicating that the communication route is normal, the master controller 110 transmits a route diagnosis packet PD3 corresponding to the communication route to the voltage-detecting IC 120-2 (S301).

Then, the voltage-detecting IC 120-2 and the voltage-detecting IC 120-3 perform steps S310 to S340, perform step S350 according to the result of step S340, transfer an error checking packet PEC3_F indicating that the communication route is defective to the master controller 110 (S352) or perform step S360, and transfer an error checking packet PEC3_N indicating that the communication route is normal to the master controller 110 (S362).

Similarly, when receiving the error checking packet PEC3_N indicating that the communication route is normal, the master controller 110 may check whether or not a defect has occurred in the communication route by transmitting a route diagnosis packet PD4 corresponding to the communication route to the voltage-detecting IC 120-3 (S302).

In this manner, when a defect has occurred in a route, the master controller 110 outputs information of the defective route (S190 in FIG. 2).

According to some example embodiments of the present invention, when communication is possible between the master controller and the slave controllers, it may be possible to detect whether or not a defect has occurred in the voltage-detecting IC or the communication route.

While this invention has been described in connection with what is presently considered to be practical example embodiments, it is to be understood that the invention is not limited to the disclosed embodiments. On the contrary, it is intended to cover various modifications and equivalent arrangements included within the spirit and scope of the appended claims, and their equivalents.

What is claimed is:

1. A battery management system comprising:
a plurality of slave controllers configured to be respectively connected with a plurality of battery modules to generate battery sensing information related to the respective battery modules; and
a master controller connected with an uppermost slave controller from among the slave controllers,
wherein each of the slave controllers includes a first receiver and a first transmitter configured to communicate with a preceding slave controller or the master controller and a second receiver and a second transmitter configured to communicate with a following slave controller, and
each of the slave controllers is configured to connect the first receiver with the first transmitter or the second receiver with the second transmitter based on diagnosis packets inputted through the first receiver, the diagnosis packets indicating whether or not there is a defect in a communication state of a voltage-detecting integrated circuit of one or more of the slave controllers.

2. The battery management system of claim 1, wherein the diagnosis packets include at least one of a first diagnosis packet that indicates one of the slave controllers or a second diagnosis packet that indicates a communication route between two slave controllers.

3. The battery management system of claim 2, wherein each of the slave controllers includes:
a voltage detector configured to generate the battery sensing information related to the connected battery modules;
an interface section configured to perform communications through the first receiver, the first transmitter, the second receiver, and the second transmitter; and
a controller configured to add test data into the first diagnosis packet received through the first receiver, to connect the second receiver and the second transmitter in a first loopback route, to transmit the first diagnosis packet added with the test data to the first loopback route, and to transmit a first error checking packet to the first transmitter when the first diagnosis packet added with the test data is not received, or when the test data added into the first diagnosis packet received through the first receiver is different from the test data included in the first diagnosis packet received through the first loopback route.

4. The battery management system of claim 3, wherein the controller is configured to connect the first receiver and the first transmitter in a second loopback route, and to transmit the second diagnosis packet to the second loopback route in response to receiving the second diagnosis packet through the first receiver.

5. The battery management system of claim 4, wherein the controller is configured to transmit a second error checking packet to the first transmitter in response to the second diagnosis packet not being received through the second receiver within a predetermined period of time.

6. The battery management system of claim 3, wherein the master controller is configured to determine, in response to receiving the first error checking packet, that a defect has occurred in a slave controller that has transmitted the first error checking packet.

7. The battery management system of claim 5, wherein the master controller is configured to determine, in response to receiving a second error checking packet, that a defect has occurred in a communication route between the slave controller that has transmitted a second error checking packet and a subsequent slave controller of the slave controller.

8. An integrated circuit comprising:
a voltage detector configured to be connected with at least one battery cell to detect a cell voltage of the at least one battery cell;
an interface section comprising:
a first receiver and a first transmitter configured to communicate with a preceding integrated circuit; and
a second receiver and a second transmitter configured to communicate with a subsequent integrated circuit; and
a controller configured to connect the first receiver with the first transmitter or the second receiver with the second transmitter based on diagnosis packets inputted through the first receiver, the diagnosis packets indicating whether or not there is a defect in a communication state of one or more of the integrated circuits.

9. The integrated circuit of claim 8, wherein the diagnosis packets include at least one of a first diagnosis packet that indicates one of a plurality of integrated circuits or a second diagnosis packet that indicates a communication route between two integrated circuits.

10. The integrated circuit of claim 9, wherein the controller is configured to:
add test data into the first diagnosis packet received through the first receiver;
connect the second receiver and the second transmitter in a first loopback route;
transmit the first diagnosis packet added with the test data to the first loopback route; and transmit a first error checking packet to the first transmitter when the first diagnosis packet added with the test data is not received, or when the test data added into the first diagnosis packet received through the first receiver is different from the test data included in the first diagnosis packet received through the first loopback route.

11. The integrated circuit of claim 10, wherein the controller is configured to:
   connect the first receiver and the first transmitter in a second loopback route; and
   transmit the second diagnosis packet to the second loopback route in response to receiving the second diagnosis packet through the first receiver.

12. The integrated circuit of claim 11, wherein the controller is configured to transmit a second error checking packet to the first transmitter in response to not receiving the second diagnosis packet through the second receiver within a predetermined period of time.

* * * * *